(12) United States Patent
Takaoka et al.

(10) Patent No.: US 6,303,262 B1
(45) Date of Patent: Oct. 16, 2001

(54) PHOTOMASK MATERIAL, PHOTOMASK AND METHODS FOR THE PRODUCTION THEREOF

(75) Inventors: Kazuchiyo Takaoka; Noriyuki Kawai; Kenji Hyodo, all of Tokyo (JP)

(73) Assignee: Mitsubishi Paper Mills Ltd., Tokyo (JP)

( * ) Notice: Subject to any disclaimer, the term of this patent is extended or adjusted under 35 U.S.C. 154(b) by 0 days.

(21) Appl. No.: 09/335,176

(22) Filed: Jun. 17, 1999

(30) Foreign Application Priority Data

Jun. 18, 1998 (JP) .................................................. 10-170418
Aug. 21, 1998 (JP) .................................................. 10-235506

(51) Int. Cl.⁷ ................................ G03C 8/28; G03C 8/52
(52) U.S. Cl. .......................... 430/231; 430/227; 430/248
(58) Field of Search .................................... 430/227, 231, 430/248

(56) References Cited

U.S. PATENT DOCUMENTS

| | | | |
|---|---|---|---|
| 3,235,599 | * 2/1966 | Green et al. | 430/227 |
| 3,894,871 | * 7/1975 | Land | 430/227 |
| 3,960,560 | 6/1976 | Sato | 156/13 |
| 3,966,473 | 6/1976 | Sato | 156/13 |
| 4,113,486 | 9/1978 | Sato | 156/657 |
| 4,168,168 | 9/1979 | Sato | 430/5 |
| 4,246,328 | 1/1981 | Sato et al. | 430/5 |
| 4,246,828 | 1/1981 | Tamashiro | 411/45 |
| 4,284,713 | 8/1981 | Sato | 430/323 |
| 4,309,495 | 1/1982 | Ernsberger | 430/5 |
| 5,496,679 | * 3/1996 | Hauguier et al. | 430/227 |
| 5,851,722 | * 12/1998 | Coppens et al. | 430/227 |
| 5,871,879 | * 2/1999 | Verlinden et al. | 430/227 |

FOREIGN PATENT DOCUMENTS

| | | |
|---|---|---|
| A 546598 | 6/1993 | (EP) . |
| 53-2727 B | 10/1973 | (JP) . |
| 49-9975 A | 1/1974 | (JP) . |
| 52-111382 A | 9/1977 | (JP) . |
| 60-41340 B | 1/1978 | (JP) . |
| 55-115042 A | 9/1980 | (JP) . |
| 57-26852 A | 2/1982 | (JP) . |
| 62-85254 A | 4/1987 | (JP) . |
| 6-273867 A | 9/1994 | (JP) . |
| 9-61963 A | 9/1997 | (JP) . |

OTHER PUBLICATIONS

Sakka, T., "Science of Sol–Gel Method," (English Abstract attached) (1988).
Klein, L., "Sol–Gel Optics: Processing and Applications," (1994).
Rott et al, "Photographic Silver Halide Diffusion Processes," (1972).

* cited by examiner

Primary Examiner—Richard L. Schilling
(74) Attorney, Agent, or Firm—Nixon & Vanderhye

(57) ABSTRACT

Disclosed are a photomask material for preparing a photomask having excellent heat resistance, ultraviolet resistance and image strength, a photomask having the above properties and methods for the production thereof, and the present invention provides a photomask material, which comprises a glass substrate, a physical development nucleus layer and a photosensitive layer containing silver halide, the layers being consecutively formed on the transparent substrate, and a method for the production thereof, and a photomask, which comprises a transparent substrate, a physical development nucleus layer and a light shielding film formed of a predetermined pattern of a silver film derived from silver halide, the silver film being formed by the action of the physical development nucleus in said layer during development treatment, the physical development nucleus layer and the light shielding film being consecutively formed on the transparent substrate, and a method for the production thereof.

4 Claims, No Drawings

PHOTOMASK MATERIAL, PHOTOMASK AND METHODS FOR THE PRODUCTION THEREOF

BACKGROUND OF THE INVENTION

1. Field of the Invention

The present invention relates to a photomask material, a photomask and methods for the production thereof. More specifically, it relates to a photomask material for preparing a photomask for fabricating a circuit pattern, which mask is excellent in heat resistance, ultraviolet resistance and image strength and does not cause an environmental pollution, and a method for the production thereof, and it also relates to a photomask having the above properties and a method for the production thereof by a simple method.

2. Related Art Statement

Photomask are frequently used for forming circuit patterns in the production of semiconductor devices, liquid crystal display devices, and the like. The photomask for forming circuit patterns include an emulsion mask prepared by applying a photographic emulsion containing silver halide to a transparent substrate such as a film or a glass and a hard mask prepared by forming a light shielding film of a metal such as chromium, and these masks are generally used. In the emulsion mask, a photosensitive emulsion layer containing silver halide is irradiated with light, and an image is developed to form a black image. The emulsion mask using the above silver halide photography can be easily intensified in sensitivity, and the process for preparing the photomask is very easy. Since, however, the emulsion mask uses gelatin as a main binder for a photosensitive layer, it has defects that it is easily scratched when it is used a plurality of times as a contact photomask and that it is apt to be thermally deteriorated or colored due to heat generated by an exposure light source, or easily optically deteriorated and colored due to an ultraviolet light source.

In the hard mask, generally, a photoresist is applied to a glass substrate (blank) having a metal thin film as a light shielding film, followed by many steps of pre-baking, exposure, development, post-baking, descumming, etching, descumming, resist peeling and washing, to form an image. The hard mask is excellent in image strength, heat resistance and ultraviolet light durability. However, not only the steps of producing the photomask are complicated, but also the hard mask successfully attained no high sensitivity sufficient for a laser light source. Moreover, chromium is a main stream as a material for forming the light shielding film, and in recent years, it is demanded to employ other method eliminating an environmental problem caused by the use of chromium.

Besides the above method, further, as a method for preparing a photomask having a light shielding film formed of a metal thin film on a glass substrate, while using no organic binder such as gelatin, various methods have been proposed in which a silver halide photographic emulsion which can easily attain a high sensitivity is applied.

For example, U.S. Pat. No. 4,168,168 discloses a method in which a photosensitive material having a silver halide emulsion layer on a glass substrate, a so-called emulsion mask structure, is exposed and treated for development, then, the emulsion layer of an exposed portion or an unexposed portion is removed and silver ion or copper ion is supplied to form a metal image in a portion from which the emulsion layer has been removed. In the above heat treatment. U.S. Pat. No. 4,309,495 discloses a method in which a photosensitive material having the above emulsion mask structure is exposed and treated for development and then a developed silver is moved into a glass substrate by the application of a voltage and an increase in temperature, to form an image.

JP-B-53-2727, JP-B-60-41340, JP-A-6-273867, U.S. Pat. No. 3,960,560, U.S. Pat. No. 3,966,473, U.S. Pat. No. 4,113,486, U.S. Pat. No. 4,246,828 and U.S. Pat. No. 4,284,713 disclose methods in which a photosensitive material having a light shielding film formed of a metal or a metal oxide as a masking layer between a glass substrate and a silver halide emulsion layer is exposed and treated for development, a resist is formed on the light shielding film by an etch-bleaching or other method and is etched to peel a mask imagewise.

Further, JP-A-49-9975, JP-A-52-111382 and JP-A-57-26852 disclose methods in which a photosensitive material formed of a glass substrate, a mask layer, a photopolymer layer and a silver halide emulsion layer is exposed to photo-react the silver halide emulsion first, the silver halide emulsion layer is treated for development, then the material is exposed to photo-react the photopolymer and the photopolymer is treated for development and etched, to peel a mask imagewise.

As described above, the above conventional methods of forming a metal thin film by applying a silver halide emulsion requires complicated steps of exposure, heating after development, etching, application of a voltage, and the like, and there is desired a photomask having a light shielding film formed of a metal thin film on a glass substrate, which can be produced by a simple method.

DISCLOSURE OF THE INVENTION

It is a first object of the present invention to provide a photomask material for forming a photomask, which is excellent in heat resistance, ultraviolet light durability and image strength and is free from environmental pollution, and which can be obtained by a simple process.

It is a second object of the present invention to provide a method for the production of the above photomask material.

It is a third object of the present invention to provide a photomask, which has the above excellent properties.

It is a fourth object of the present invention to provide a method for the production of the above photomask with a high sensitivity by a simple method.

The present inventors have made diligent studies for achieving the above objects, and as a result, have found the following.

A desired photomask material can be obtained by forming a physical development nucleus layer on a transparent substrate and applying an emulsion containing silver halide thereon to form a photosensitive layer, whereby the above first and second object of the present invention are achieved.

A desired photomask can be obtained by exposing imagewise the photosensitive layer of the above photomask material; treating the photosensitive layer for development to reduce silver halide of an exposed portion in the photosensitive layer and to dissolve the silver halide of the unexposed portion; forming a desired pattern of a silver film on the physical development nucleus layer by the action of the physical development nucleus; and further, removing the photosensitive layer, whereby the above third and fourth objects of the present invention are achieved. The present invention has been completed on the above findings.

That is, according to the present invention, the above first object of the present invention is achieved by a photomask material, which comprises a glass substrate, a physical development nucleus layer and a photosensitive layer containing silver halide, the layers being consecutively formed on the transparent substrate.

According to the present invention, the above second object of the present invention is achieved by a method for the production of a photomask material, which comprises applying a coating liquid containing a physical development nucleus to a transparent substrate to form a physical development nucleus layer, and then applying an emulsion containing silver halide thereto to form a photosensitive layer.

According to the present invention, further, the above third object of the present invention is achieved by a photomask, which comprises a transparent substrate, a physical development nucleus layer and a light shielding film formed of a predetermined pattern of a silver film derived from silver halide, the silver film being formed by the action of the physical development nucleus in said layer during development treatment, the physical development nucleus layer and the light shielding film being consecutively formed on the transparent substrate.

Further, according to the present invention, the fourth object of the present invention is achieved by a method for the production of a photomask, which comprises exposing imagewise the photosensitive layer of the above photomask material to form a latent image nucleus in silver halide in an exposed portion, then, treating the photosensitive layer to reduce the silver halide of the exposed portion in the photosensitive layer and to dissolve silver halide in an unexposed portion, thereby forming a predetermined pattern of a silver film on the physical development nucleus layer by the action of the physical development nucleus, and then removing the photosensitive layer.

Preferred Embodiments of the Invention

First, the photomask material and the method for the production thereof, provided by the present invention, will be explained.

The photomask material, provided by the present invention, comprises a glass substrate, a physical development nucleus layer and a photosensitive layer containing silver halide, the layers being consecutively formed on the transparent substrate. Examples of the transparent substrate include substrates formed of soda-lime glasses such as soda-lime glass and white crown glass, substrates of low-expansive glasses such as borosilicate glass, alkali-free glass and aluminosilicate glass, a substrate of synthetic quartz glass and a polyester film. In view of heat resistance and ultraviolet light durability, a substrate of an inorganic glass is preferred.

Examples of the physical development nucleus used in the above physical development nucleus layer include sulfides, selenides, polyselenides, polysulfides and mercaptanes of heavy metals such as antimony, bismuth, cadmium, cobalt, lead, nickel, palladium, platinum, gold, silver and zinc; salts such as tin halide (II); and heavy metals such as silver, gold, platinum, palladium and mercury. The above physical development nucleus can be used alone or in combination. Particularly preferred is palladium sulfide having an average particle diameter of 6 nm or less which is disclosed in EP-A-546,598.

In the present invention, the physical development nucleus works as a catalytic nucleus on the surface of which a soluble silver complex which has moved onto the surface is reduced to silver due to a physical development. The application amount thereof is very small, and a glass substrate is substantially transparent even if it remains on the glass substrate after treatment. The physical development nucleus differs from a light shielding film formed of a metal or a metal oxide disclosed in U.S. Pat. Nos. 3,960,560, 3,966,473, 4,113,486, 4,246,328 and 4,284,713.

In the photomask material, provided by the present invention, the physical development nucleus layer formed on a glass substrate may be supported on the glass substrate with a metal oxide, silica or both, or it may be supported on the glass substrate with an organometallic compound, its derivative or both.

The above metal oxide includes metal oxides such as colloidal alumina, titanium oxide, zinc oxide and zirconium oxide, and hydroxides corresponding thereto. As the above silica, colloidal silica is preferred. The colloidal silica is a colloidal substance of an amorphous anhydrous silicic acid, and it includes the colloidal substance which is not modified and the colloical substance which is surface-modified with an ion or a compound of ammonia, calcium or aluminium so as to alter its ionic properties or behaviors against the fluctuation of a pH. The above colloidal alumina is a colloidal substance having a feathery, fibrous or plate-like dispersion type of an alumina hydrate having the form of amorphous or pseudo-boehmite (including boehmite in a broad sense).

Further, the metal oxide includes smectites such as hectorite and montomorillonite, vermiculites, kaolinite-serpentinites such as kaolinite and halloysite, natural clay minerals such as sepiolite, fluorine micas such as fluorine gold mica, fluorine tetrasilicon mica and taeniolite, and synthetic inorganic polymer compounds such as synthetic smectite.

The above metal oxide and/or silica are/is finely dispersed in an aqueous solvent, and the dispersion is homogeneously mixed with the physical development nucleus to prepare a coating liquid. The coating liquid is applied to a transparent substrate, to form a physical development nucleus layer supported on the transparent substrate with the metal oxide and/or silica. The average particle diameter of the above finely dispersed metal oxide and/or silica is preferably in the range of from 1 nm to 100 $\mu$m.

After the above coating liquid applied onto the transparent substrate is dried, the resultant coating may be heated to 150° C. or higher for improving the bonding strength among particles of the metal oxide particles and/or silica particles. When it is heated to 600° C. or higher, however, the metal oxide particles and/or the silica particles may be caused to grow. It is therefore preferred to carry out the above heating at temperature(s) in the range of from 150° C. to 400° C.

Examples of the above oranometallic compound include tetraethoxysilane, vinyltriethoxysilane, γ-chloropropyltrimethoxysilane, γ-aminopropyltriethoxysilane, N-(β-aminoethyl)-γ-aminopropylmethyldimethoxysilane, γ-mercaptopropyltrimethoxysilane, γ-glycidoxypropyl-trimethoxysilane, γ-glycidoxypropylmethyldimethoxysilane, γ-methacryloxypropyltrimethoxysilane, γ-methacryloxypropyl-methyldimethoxysilane, aluminumisopropoxide, aluminum acetate, indium acetyl acetate, zinc acetyl acetate, zinc stearate, tetraethyl orthotitanate, tetraisopropyl orthotitanate, tetrabutyl orthotitanate and barium oxlate.

The above organometallic compounds may be used alone or in combination. Further, the organometallic compound may be used in combination with organometallic chlorides or metal chlorides such as dimethyldichlorosilane, diphenyldichlorosilane, dimethylphenylchlorosilane, aluminum chloride or a titanium tetrachloride. The organometallic compound is used to form a film, preferably, according to a sol-gel method. The film formed improves the supportability or adhesion between the transparent substrate and the physical development nucleus layer and improves the adhesion of a silver film which is finally formed.

The above sol-gel method refers to a method in which a glass or a ceramic is formed from a solution as a starting material through a state of a sol containing fine particles and a subsequent state of a sol in which liquid or air is contained in gaps of a solid network (e.g., "Science of Sol-Gel Method", T. Sakka, published by Agune Syoufusha (1988), or "Sol-Gel Optics: Processing and Applications, Lisa C. Klein, published by Kluwer Academic Publishers (1994)).

In the present invention, a coating liquid containing the organometallic compound which is in a sol state due to a reaction with water and the physical development nucleus is applied to a transparent substrate to form a coating, and the coating is dried and then heat-treated to form a physical development nucleus layer supported on the transparent substrate with the organometallic compound or its derivative.

When the transparent substrate is a substrate having a residual surface hydroxyl group, such as a glass substrate, the organometallic compound can chemically bond to the transparent substrate surface, e.g., by a substitution reaction of alkoxy group in an organosilicon compound or an organotitanium compound. When an organosilicon compound is used, the supportability to the physical development nucleus layer can be improved by the bonding of functional groups existing in the molecule of the organosilicon compound, such as amino groups, thiol groups or glycidyl groups, to hydroxyl groups on the surface of the substrate. When an organotitanium compound is used, the supportability to the physical development nucleus layer can be improved by improving the transparent substrate surface in acid resistance and alkali resistance. The above compounds may be used alone, while they may be used in combination.

The amount of the physical development nucleus constituting the physical development nucleus layer formed on the transparent substrate is preferably in the range of from 0.4 to 25 mg/m$^2$, particularly preferably 1 to 20 mg/$^2$. When the physical development nucleus layer is supported with a gelatin layer, the film strength is improved by using a film-hardening agent such as triazine trichloride, and as a result, a strong light shielding film can be obtained. When the metal oxide, silica or the organometallic compound is used as a mixture with the physical development nucleus, the amount thereof based on 1 part by weight of the physical development nucleus is preferably 0.01 to 100,000 parts by weight, more preferably 1 to 10,000. When titanium oxide or zinc oxide is used, these compounds themselves have absorbability of ultraviolet light, and therefore, it is preferred that the amount thereof for use should be as small as possible.

In the present invention, the physical development nucleus may be contained in the above layer comprising the above metal oxide, silica, organometallic compound or derivative thereof. Alternately, there may be employed an embodiment in which a layer containing any one of these is formed on a transparent substrate and the physical development nucleus layer is formed thereon, as already described. When a layer containing titanium oxide or zinc oxide is formed on a transparent substrate, it is preferred that the thickness thereof should be as small as possible for the above-described reason.

In the present invention, the physical development nucleus layer is formed on a transparent substrate or on a layer containing the metal oxide, silica, the organometallic compound or its derivative as described above. Thereafter an emulsion containing silver halide (to be sometimes referred to as "silver halide emulsion" hereinafter) is applied onto the physical development nucleus layer, to form a photosensitive layer.

The above silver halide includes silver chloride, silver chlorobromide, silver chloroiodide and silver chloroiodobromide. These silver halides may be used alone or in combination. The crystal structure of the silver halide is not critical, and the silver halide can be selected from silver halides having known various crystal structures such as cubic, octahedral, tarbular and core-shell grain. The average particle diameter of the silver halide grain for use in the present invention is preferably in the range of from 0.2 to 0.5 $\mu$m. Further, an iridium compound or a rhodium compound may be incorporated as required when the silver halide grain is prepared. Further, the silver halide may be reductively sensitized or chemically sensitized as required for attaining a higher sensitivity or a higher contrast property.

The silver halide emulsion for use in the present invention can be spectrally sensitized by incorporating a known sensitizing dye as required for matching it with various light sources such as an argon laser, a helium neon laser, a semiconductor laser and a laser diode. The sensitizing dye is properly selected depending upon the wavelength of an exposure light source or an additive to be incorporated. The dye includes a cyanine dye, a merocyanine dye, a rhodacyanine dye, an oxonol dye, a styryl dye and a base styryl dye. These dyes may be used alone or in combination.

Further, the silver halide emulsion may contain known additives so long as the object of the present invention is not impaired. Examples of the additives include surfactants such as anionic, cationic, betaine and nonionic surfactants, thickeners such as carboxymethyl cellulose, coating auxiliaries such as defoamer, chelating agents such as ethylenediamine tetraacetate, and developing agents such as hydroquinone, polyhydroxybenzenes and 3-pyrazolidinones. Further, stabilizers such as azaindenes and a heterocyclic mercapto compound and a fogging preventing agent may be also incorporated.

For forming a photosensitive layer, the above silver halide emulsion contains, as a binder, a water-soluble gelatin alone or a combination of a water-soluble gelatin with casein, dextrin, gum arabic, polyvinyl alcohol or starch. The above water-soluble gelatin includes acid-treated gelatin, alkali-treated gelatin, a gelatin derivative and grafted gelatin. In the present invention, the photosensitive layer may be hardened by incorporating a known hardener into the silver halide emulsion. Preferably, however, removal with warm water after developing treatment is easier when no hardener is substantially added.

In the present invention, the above silver halide emulsion is applied onto the physical development nucleus layer and a formed coating is dried to form a photosensitive layer. The content of silver halide in the photosensitive layer is preferably 10 to 90% by weight, and the thickness of the photosensitive layer is generally in the range of from 0.5 to 20 $\mu$m, preferably 2 to 15 $\mu$m.

The photomask material, provided by the present invention, may have an intermediate layer and a protective layer as required in addition to the above physical development nucleus layer and the above photosensitive layer.

The photomask material, provided by the present invention, is obtained as described above.

The photomask and the method for the production thereof, provided by the present invention, will be explained hereinafter.

The photomask, provided by the present invention, comprises a transparent substrate and a silver film formed on the transparent substrate, the silver film being formed by using the above photomask material, provided by the present invention, and applying a silver complex diffusion transfer process (to be referred to as "DTR process" hereinafter). The DTR process is disclosed in U.S. Pat. No. 2,352,014 or "Photographic Silver Halide Diffusion Processes", Andre Rott and Edith Weyde, published by the Focal Press (1972). In the DTR process, during development treatment, silver halide in an unexposed portion is dissolved and converted to a soluble silver complex compound, and the compound is diffused through the photosensitive layer and developed (reduced) in a site where the physical development nucleus is present, to form a silver film. On the other hand, silver halide in an exposed portion forms a latent image nucleus due to exposure, and the silver halide is developed in the photosensitive layer due to the latent image nucleus.

Then, the photosensitive layer is removed, e.g., with hot water, whereby only the silver film formed on the physical development nucleus layer in the unexposed portion remains on the transparent substrate to form an image. The silver film is a film which absorbs visible light or ultraviolet light or a film which reflects them, and it works as a light shielding film in a photomask for exposing a pattern of an electronic circuit.

The present inventors have found that there can be produced a photomask having a light shielding metal film (silver film) on a transparent substrate such as a glass substrate by a very simple method which is as simple as a method of developing an emulsion mask, said photomask having performances equivalent of those of a hard mask and achieving a high sensitivity sufficient for directly drawing an image with a laser.

In the above method, generally, a light shielding film of a positive image formed of a silver film can be formed on an unexposed portion. On the other hand, if a latent image nucleus is formed in silver halide in advance and if an election trapping substance is used around silver halide, the latent image is extinguished in an exposed portion by oxidation, whereby a light shielding film of a negative image can be formed.

Specifically, the photomask, provided by the present invention, comprises a transparent substrate, a physical development nucleus layer and a light shielding film formed of a predetermined pattern of a silver film derived from silver halide, the silver film being formed by the action of the physical development nucleus in said layer during development treatment, the physical development nucleus layer and the light shielding film being consecutively formed on the transparent substrate. As explained with regard to the above photomask material of the present invention, preferably, the physical development nucleus layer in the photomask is supported on the transparent substrate with the metal oxide, silica or both, or the physical development nucleus layer is supported on the transparent substrate with the organometallic compound, its derivative or both.

Further, the photomask, provided by the present invention, preferably has a protective layer on the light shielding film formed of a silver film. The protective layer contains at least one selected from a metal oxide, silica, an organometallic compound, a derivative thereof or an acrylic resin composite. The above metal oxide, the above silica, the above organometallic compound and the derivative thereof can be selected from those which have been explained as materials for supporting the physical development nucleus layer on the transparent substrate with regard to the above photomask material, provided by the present invention.

The above acrylic resin composite can be obtained by compositing colloidal silica and an acrylic resin, e.g., according to a sol-gel method. The above composite of colloidal silica and an acrylic resin can be obtained, e.g., by hydrolyzing tetramethoxysilane in the presence of an acrylic polymer containing methacryloxysilane as a monomer. When the above composite of a resin is formed, the formability of the protective layer at low temperatures is remarkably improved as compared with the formability of a protective layer of a colloidal silica alone. Further, a crosslinked film can be formed by thermal crosslinking or by photo crosslinking with a residual unreacted methacrylate or acrylate group. The photo crosslinking is particularly advantageous since the time period for the production can be remarkably decreased.

In the present invention, the thickness of the protective layer formed on the light shielding film is preferably in the range of from 0.01 to 100 μm, particularly preferably 0.1 to 50 μm. The above protective layer has excellent adhesion to the light shielding film and has a high surface hardness, so that it works to prevent an image defect caused by surface friction.

JP-A-55-115042 discloses a method of improving the strength of an image by coating an image portion on a photo-etching glass mask with a glass film. In this method, the glass film is formed by a sputtering method, so that an apparatus of a large scale is required. Further, since the glass film is liable to undergo cracking, a two-layered structure is employed, which makes the production less simple. In contrast, in the present invention, the protective layer has high adhesion to the light shielding film formed of a silver film, and no defect due to a surface unevenness is caused in the protective layer structure, so that there are fewer limitations to be imposed on the formation of the protective layer. The method of forming the protective layer in the present invention can be therefore said to be very simple.

Further, JP-A-55-115042, JP-A-62-85254 and JP-A-9-61963 disclose other methods of forming a protective layer on a photomask, while all of these intend to protect an image of an emulsion mask constituted of a binder containing gelatin as a main component. Therefore, they differ from the present invention in object and also differ from the present invention in embodiments.

The photomask having the above constitution, provided by the present invention, can be simply produced with high sensitivity according to the following method of the present invention.

In the method of the present invention, the above photomask material, provided by the present invention, is used. The photosensitive layer of the photomask material is exposed imagewise to form a latent image nucleus in silver halide in an exposed portion, then, the photosensitive layer is treated to reduce the silver halide of the exposed portion in the photosensitive layer and to dissolve silver halide in an unexposed portion, whereby a predetermined pattern of a silver film is formed on the physical development nucleus layer by the action of the physical development nucleus, and then, the photosensitive layer is removed. Then, a protective layer is formed on a light shielding film formed of the above-formed silver film as required. The protective layer contains at least one selected from the metal oxide, the silica, the organometallic compound, the derivative thereof or the acrylic resin composite.

A developer solution used for the development treatment contains, for example, a developing agent such as polyhydroxybenzenes or 3-pyrazolidinones; an alkaline substance such as potassium hydroxide, sodium hydroxide, lithium hydroxide, sodium tertiary phosphate or an amine compound; a preservative such as sodium sulfite; a thickener such as carboxymethyl cellulose; an antifoggant such as potassium bromide; a development modifier such as a polyoxyalkylene compound; and a silver halide solvent such as thiosulfate, thiocyanate, cycloimide, thiosalicylic acid or a meso-ionic compound. The pH of the above developer solution is generally in the range of from 10 to 14, preferably 12 to 14.

Further, for removing the photosensitive layer, generally, warm water is used.

A desired photomask can be efficiently obtained with a high sensitivity by a simple method as explained above.

The photomask, provided by the present invention, is excellent in heat resistance, ultraviolet light durability and image strength and is free from causing environmental pollution, and it can be suitably used for forming a circuit pattern in the process of producing semiconductor devices, liquid crystal devices, and the like.

The present invention will be explained further in detail with reference to Examples hereinafter, while the present invention shall not be limited by these Examples.

EXAMPLE 1

(1) Preparation of physical development nucleus liquid

First, an aqueous solution containing 1% by weight of a photographic gelatin (supplied by Nitta Gelatin Inc.) was prepared. Further, 1,800 parts by weight of distilled water was added to 200 parts by weight of the above aqueous solution, and at 30° C., 1.77 parts by weight of palladium chloride, 3.16 parts by weight of sodium thiosulfate and 0.39 parts by weight of sodium sulfide were added, to form palladium sulfide as a physical development nucleus. The above palladium sulfide had an average nucleus diameter of 1.5 nm.

(2) Formation of physical development nucleus layer

10 Parts by weight of an aqueous solution containing 1% by weight of a photographic gelatin was mixed with 0.01 part by weight of triazine trichloride, and further, 10 parts by weight of the physical development nucleus liquid prepared in the above (1) was added. The resultant mixture was applied to a glass substrate with a spinner supplied by Able Co., Ltd., to form a coating having a solid content thickness of 0.1 $\mu$m. The coating was dried under heat at 80° C. for 30 minutes, to form a physical development nucleus layer.

(3) Formation of photosensitive layer

First, a silver halide emulsion having an average particle diameter of 0.2 $\mu$m was prepared. The obtained silver halide emulsion contained 70 parts by weight of silver halide, 30 parts by weight of a photographic gelatin (supplied by Nitta Gelatin Inc.) and 300 parts by weight of distilled water and was doped with rhodium chloride and iridium chloride. The silver halide emulsion was applied onto the physical development nucleus layer formed on the glass substrate, and the resultant coating was dried at 25° C. for 1 hour to form a photosensitive layer having a thickness of 4 $\mu$m, whereby a photomask material was obtained. The steps of the preparation, application and drying of the emulsion were all carried out in a dark room.

(4) Preparation of developer solution

A solution containing the following components was prepared and used as a developer solution.

| | |
|---|---|
| Carboxymethyl cellulose | 4.0 parts by weight |
| Sodium hydroxide | 22.5 parts by weight |
| Anhydrous sodium sulfite | 120.0 parts by weight |
| Hydroquinone | 20.0 parts by weight |
| 1-Phenyl-3-pyrazolinone | 6.0 parts by weight |
| Potassium bromide | 0.8 part by weight |
| Anhydrous sodium thiosulfate | 8.0 part by weight |
| Ethylenediamine tetrasodium tetraacetic acid salt | 2.0 parts by weight |
| Distilled water | 1,000.0 parts by weight |

(5) Exposure and development treatments

Four fluorescence lamps having a power of 10 W each were arranged side by side, and the photomask material was irradiated through a mask with the lamps located above, and 50 cm far from, the photosensitive layer for 30 seconds. Then, the resultant photomask material was immersed in the developer solution at 25° C. for 30 seconds to carry out development treatment according to the DTR process. Then, the photosensitive layer was removed with warm water at 35° C., to form a light shielding film of a silver film on the transparent substrate, whereby a photomask was obtained. The light shielding film has an optical transmissivity of 2.0% at 380 nm.

EXAMPLE 2

To 10 parts by weight of the physical development nucleus liquid prepared in Example 1 was added 0.3 part by weight of a colloidal silica ("Snowtex OUP, supplied by Nissan Chemical Industries, Ltd.), and the resultant mixture was applied onto a glass substrate with a spinner supplied by Able Co., Ltd. The glass substrate was dried under heat at 250° C. to form a physical development nucleus layer having a thickness of 0.5 $\mu$m. Then, a photosensitive layer was formed on the physical development nucleus layer in the same manner as in Example 1, followed by the same exposure, development and removal of the photosensitive layer as those in Example 1, to give a photomask. The formed light shielding film had a transmissivity of 1.2% to ultraviolet light.

The obtained photomask was exposed to an ultraviolet lamp having a high power of 120 mW for 2 hours, to show no deterioration of the light shielding film and an image. Further, the mask was heated at 200° C. for 6 hours to show no deterioration of the light shielding film and the image.

Further, as a comparative example, the above photosensitive layer was formed directly on a glass substrate, the photosensitive layer was treated with a developer solution ("GEKKOL", supplied by Mitsubishi Paper Mills, Ltd.) for development, and a developed image was fixed with a fixing liquid ("DIA SUPER FIX" supplied by Mitsubishi Paper Mills, Ltd.), followed by washing with water and drying, to prepare a comparative emulsion mask. The comparative emulsion mask showed a discoloration to brown when exposed to ultraviolet light and heated.

EXAMPLE 3

A photomask was prepared in the same manner as in Example 2 except that the same colloidal silica and the same physical development nucleus as those in Example 2 are consecutively applied to a glass substrate in this order in place of the preparation of a mixture of the colloidal silica with the physical development nucleus. A formed light shielding film had a transmissivity of 1.0% to ultraviolet light.

EXAMPLE 4

2.2 Parts by weight of palladium acetate, 3.0 parts by weight of Bismuthiol and 28.4 parts by weight of tetrapropyl orthotitanate were added to 1,000 parts by weight of dehydrated methyl ethyl ketone, and the mixture was applied onto a glass substrate. The glass substrate was dried at 60° C. for 20 minutes and then heated at 250° C. for 30 minutes to form a physical development nucleus layer having a thickness of 0.03 μm. Then, a photosensitive layer was formed on the physical development nucleus layer in the same manner as in Example 1, followed by the same exposure, development and removal of the photosensitive layer as those in Example 1, to give a photomask. The obtained photomask was exposed to an ultraviolet lamp having a high power of 120 mW for 2 hours, to show no deterioration of the light shielding film and an image. Further, the photomask was heated at 200° C. for 6 hours to show no deterioration of the light shielding film and the image.

EXAMPLE 5

2.2 Parts by weight of palladium acetate and 2.0 parts by weight of γ-mercaptopropyltrimethoxysilane were added to 1,000 parts by weight of dehydrated methyl ethyl ketone, and the mixture was applied to a glass substrate. The glass substrate was heated up to 40° C. in dry air, and was allowed to stand for 2 hours. The glass substrate was washed with acetone, to form a physical development nucleus layer. Then, a photosensitive layer was formed on the physical development nucleus layer in the same manner as in Example 1, followed by the same exposure, development and removal of the photosensitive layer as those in Example 1, to give a photomask. The formed light shielding film had a transmissivity of 1% to ultraviolet light.

EXAMPLE 6

A titania sol ("TA-15" supplied by Nissan Chemical Industries, Ltd.) was applied onto a glass substrate with a spinner supplied by Able Co., Ltd., and the glass substrate was dried under heat at 150° C. for 30 minutes. 5 Parts by weight of palladium chloride and 8 parts by weight of sodium sulfide were mixed in 87 parts by weight of an aqueous solution containing 3% by weight of polyethylene glycol alkyl ether to prepare a palladium sulfide physical development nucleus liquid which is free of gelatin. The palladium sulfide physical development nucleus liquid was applied onto the above titania sol coating on the glass substrate with the spinner to form a physical development nucleus layer having a solid content thickness of 0.05 μm. Then, a photosensitive layer was formed on the physical development nucleus layer in the same manner as in Example 1 except that the silver halide emulsion was replaced with a silver halide emulsion which was prepared by spectrally sensitizing the same silver halide emulsion as that in Example 1 by adding a sensitizing dye of the following formula. Thus a photomask material was prepared.

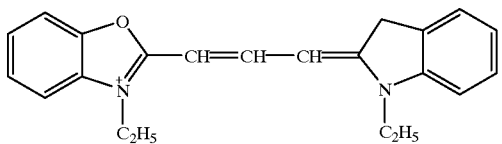

A line/space pattern of 50 μm was drawn on the above-obtained photomask material with a laser plotter ("FR-8000, supplied by Dainippon Screen MFG. Co., Ltd.) and developed with the same developer solution as that in Example 1, and the photosensitive layer was removed to give a mask pattern, whereby a photomask was obtained. The light shielding film portion had an ultraviolet transmissivity of 0.001%. A portion free of the light shielding film was observed through a magnifier, to show no formation of an abnormal image which did not correspond to an image outputted by the laser plotter.

Further, the comparative emulsion photomask Material prepared in Example 2 was subjected to the same exposure as the above, followed by the same development, fixing, washing with water and drying treatment as those in Example 2, to obtain a comparative mask. A portion free of the light shielding film was observed through a magnifier, to show formation of a low-density abnormal image which did not correspond to an image outputted by the laser plotter.

EXAMPLE 7

A colloidal silica ("Snowtex" supplied by Nissan Chemical Industries, Ltd., concentration 33% by weight) was diluted 120 times with water, and the diluted colloidal silica was applied onto the light shielding film of the same photomask as that obtained in Example 2, and the glass substrate was heated at 250° C. for 1 hour to form a protective film having a thickness of 0.12 μm. The photomask was improved in surface hardness and showed no defect of an image caused by forced violent wiping.

EXAMPLE 8

25 Parts by weight of tetraethoxysilane, 376 parts by weight of ethanol, 235 parts by weight of water, 2 parts by weight of titanium isopropoxide and 0.5 part by weight of acetic acid were mixed, and the mixture was applied onto the light shielding film of the same photomask as that obtained in Example 2, with a spinner supplied by Able Co., Ltd. The glass substrate was heated at 250° C. for 1 hour to form a protective film having a thickness of 0.5 μm. The photomask was improved in surface hardness and showed no defect of an image caused by forced violent wiping.

EXAMPLE 9

An organo-inorgano-hybridized hard coating agent (trade name "DeSolite", supplied by JSR Corporation), in which an acryl group was present on the surface of colloidal silica having a particle diameter of approximately 10 nm, was applied onto the light shielding film of the same photomask as that obtained in Example 2, with a spinner supplied by Able Co., Ltd. The resultant coating was exposed to ultraviolet light with a 120 kW UV lamp (supplied by Fusion Japan) for 5 seconds, to form a protective film having a thickness of 0.5 μm. The photomask was improved in surface hardness and showed no defect of an image caused by forced violent wiping.

What is claimed is:

1. A photomask material, which comprises a glass substrate, a physical development nucleus layer and a photosensitive layer containing silver halide, the layers being consecutively formed on the transparent glass substrate, wherein interposed between the physical development nucleus layer and the glass substrate is a layer of an organotitanium compound chemically bonded to the glass substrate.

2. A photomask material, which comprises a glass substrate, a physical development nucleus layer and a photosensitive layer containing silver halide, the layers being formed on the glass substrate, wherein the photomask material includes a layer comprising titanium oxide, substantially free of an organic polymer, between the glass substrate and the physical development layer, and the physical development nucleus layer is supported on the glass substrate with the titanium oxide.

3. A photomask material, which comprises a glass substrate, a physical development nucleus layer and a photosensitive layer containing silver halide, the layers being consecutively formed on the glass substrate, wherein the physical development nucleus layer comprises at least one member selected from a titanium oxide, an organotitanium compound and a combination thereof.

4. The photomask material of claim 1, 2 or 3 wherein the photosensitive layer is spectrally sensitized with a sensitizing dye together with the silver halide.

\* \* \* \* \*